US009851744B2

(12) United States Patent
Dearth et al.

(10) Patent No.: US 9,851,744 B2
(45) Date of Patent: Dec. 26, 2017

(54) ADDRESS AND CONTROL SIGNAL TRAINING

(71) Applicant: Advanced Micro Devices, Inc., Sunnyvale, CA (US)

(72) Inventors: Glenn Dearth, Groton, MA (US); Anwar Kashem, Sudbury, MA (US); Sean Cummins, Hollis, NH (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 385 days.

(21) Appl. No.: 14/566,265

(22) Filed: Dec. 10, 2014

(65) Prior Publication Data

US 2016/0172013 A1 Jun. 16, 2016

(51) Int. Cl.
*G11C 8/00* (2006.01)
*G06F 1/10* (2006.01)
*G06F 13/00* (2006.01)
*G06F 13/16* (2006.01)
*G11C 7/22* (2006.01)

(52) U.S. Cl.
CPC ............... *G06F 1/10* (2013.01); *G06F 13/00* (2013.01); *G06F 13/1689* (2013.01); *G11C 7/22* (2013.01)

(58) Field of Classification Search
None
See application file for complete search history.

(56) References Cited

U.S. PATENT DOCUMENTS

| | | | | |
|---|---|---|---|---|
| 6,664,838 B1 * | 12/2003 | Talledo | ..................... | G11C 7/22 327/277 |
| 7,924,637 B2 | 4/2011 | Searles et al. | | |
| 2007/0033337 A1 * | 2/2007 | Butt | ...................... | G11C 7/1051 711/105 |
| 2007/0194822 A1 * | 8/2007 | Kumata | ................ | H03L 7/0814 327/158 |
| 2013/0021075 A1 * | 1/2013 | Felix | ......................... | G06F 1/10 327/164 |

(Continued)

OTHER PUBLICATIONS

JEDEC Solid State Technology Association, "JEDEC Standard DDR4 SDRAM," JEDEC Standard No. 79-4 (JESD79-4), 214 pages, Sep. 2012.

*Primary Examiner* — Uyen B Tran
(74) *Attorney, Agent, or Firm* — Polansky & Associates, P.L.L.C.; Paul J. Polansky (57) ABSTRACT

In one form, an apparatus comprises a delay circuit and a controller. The delay circuit delays a plurality of command and address signals according to a first delay signal and provides a delayed command and address signal to memory interface. The controller performs command and address training in which the controller provides an activation signal and a predetermined address signal with first timing according to the first delay signal, and the plurality of command and address signals besides the predetermined address signal with second timing according to the first delay signal, wherein the second timing is relaxed with respect to the first timing. The controller determines an eye of timing for the predetermined address signal by repetitively providing a predetermined command on the command and address signals, varying the first delay signal, and measuring a data signal received from the memory interface.

20 Claims, 6 Drawing Sheets

(56) References Cited

U.S. PATENT DOCUMENTS

| | | | | |
|---|---|---|---|---|
| 2013/0077427 A1* | 3/2013 | Kondo | ................. | G11C 8/18 365/230.06 |
| 2013/0163354 A1* | 6/2013 | Song | ................. | G11C 7/1006 365/194 |

* cited by examiner

FIG. 7

ADDRESS AND CONTROL SIGNAL TRAINING

FIELD

This disclosure relates generally to data accessing systems, and more specifically to signal training for data high-speed data accessing systems such as computer memory controllers.

BACKGROUND

Modern microprocessors typically include a central processing unit (CPU) and a memory controller for controlling accesses to and from main memory. Most main memory in modern computer systems is double data rate (DDR) dynamic random access memory (DRAM) that conforms to standards set forth by the Joint Electron Devices Engineering Councils (JEDEC). The original DDR standard was published in 2000 and has over time been enhanced to include standards known as DDR2, DDR3, and DDR4.

The JEDEC standard interface specifies that during a read operation, the DDR DRAM will issue DQ (data) and DQS (data strobe) signals at the same time, a manner commonly referred to as "edge aligned." in order for the DRAM controller to correctly acquire the data being sent from the DDR DRAM, the DRAM controller typically utilizes delay-locked loop (DLL) circuits to delay the DQS signal so that it can be used to correctly latch the DQ signals. Topological and electrical difference between DQ and DQS interconnects result in timing skew between these signals, making it important to establish a proper delay for the DLL. For similar reasons, the DRAM controller also utilizes DLL circuits to support the writing of data to the DDR DRAM.

The timing delays needed by the DLL circuits will vary based on board layout and operating conditions and so are customized for each design configuration each time the device is turned on by executing a training program. The training program is typically a software program stored in a basic input/output system (BIOS) memory device, but it can also be implemented within the device hardware. The training program executes an algorithm to determine appropriate timing delays associated with each memory interface signal.

Moreover, memory chips now operate at far higher speeds than the speeds of the original DDR DRAMs. For example, the DDR4 standard now specifies operation at 1600 MHz, 1866 MHz, and 2133 MHz. At these extremely high speeds, skew between signals becomes significant and difficult to train. The DDR4 standard has added features to facilitate signal training, including command and address training. For example, DDR4 DRAMs perform parity checks on command and address signals and activate an alert signal in response to detecting a parity error. However these features require two extra pins on the microprocessor and thus add to product cost.

In the following description, the use of the same reference numerals in different drawings indicates similar or identical items. Unless otherwise noted, the word "coupled" and its associated verb forms include both direct connection and indirect connection by means known in the art, and unless otherwise noted any description of direct connection implies alternate embodiments using suitable forms of indirect connection as well.

DETAILED DESCRIPTION OF ILLUSTRATIVE EMBODIMENTS

In one form, an apparatus comprises a delay circuit and a controller. The delay circuit delays a plurality of command and address signals according to a first delay signal and provides a plurality of delayed command and address signals to memory interface. The controller performs command and address training in which the controller provides an activation signal and a predetermined address signal with first timing according to the first delay signal, and the plurality of command and address signals besides the predetermined address signal with second timing, wherein the second timing is relaxed with respect to the first timing. The controller determines an eye of timing for the select signal by repetitively providing a predetermined command on the command and address signals, varying the first delay signal, and measuring a data signal received from the memory interface.

In another form, an apparatus comprises a memory interface, a data processor, and a memory system. The data processor generates memory access requests during a normal operation mode and provides the memory access requests to the memory interface using a memory access controller. The memory system is coupled to the memory interface, and receives and responds t the memory access requests. In a training mode, the memory access controller performs command and address training by providing an activation signal and a predetermined address signal with first timing according to a first delay signal. It also provides a plurality of command and address signals besides the predetermined address signal with second timing, wherein the second timing is relaxed with respect to the first timing. The memory access controller determines an eye of timing for the activation signal by repetitively providing a predetermined command on the command and address signals, varying the first delay signal, and measuring a data signal received from the memory interface.

In yet another form, a method for training command and address signals to be provided on a memory interface comprises, for each of a plurality of values of a first delay signal, issuing a read command to the memory interface by providing an activation signal with first timing based on a clock signal, a selected address signal with first timing according to the first delay signal, and a plurality of command and additional address signals with second timing, wherein the second timing is relaxed with respect to the first timing, and receiving a data feedback signal in response to the read command. The first delay signal is set to a selected variable delay corresponding to a data eye of the plurality of values of the first delay signal.

Figure 1:
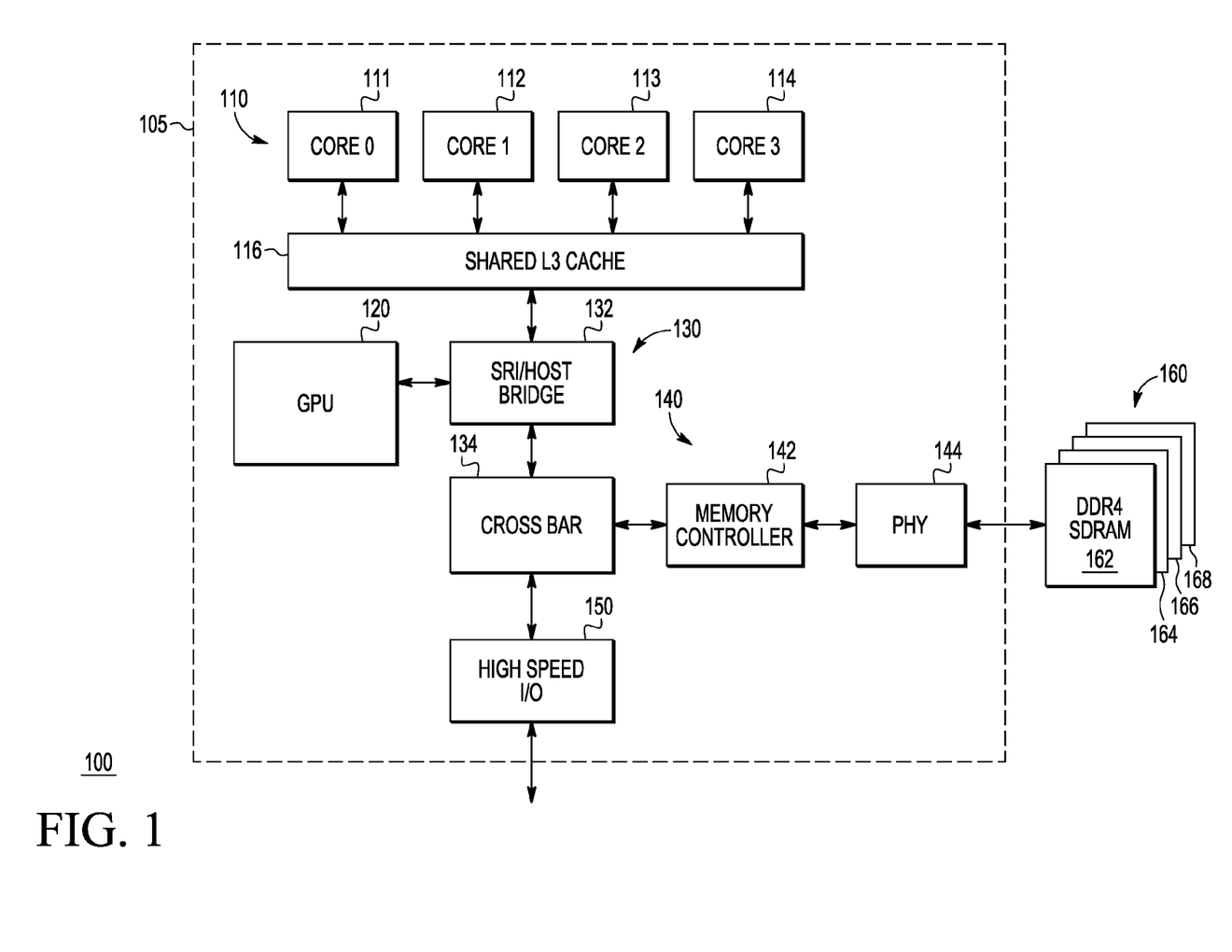
FIG. 1 illustrates in block diagram form a data processing system having a memory controller with command and address training according to some embodiments.

FIG. 1 illustrates in block diagram form a data processing system 100 having a memory controller 140 with command and address training according to some embodiments. Data processing system 100 includes generally a data processor 105 and a memory system 160.

Data processor 105 generally includes a CPU portion 110, a GPU core 120, an interconnection circuit 130, a memory access controller 140, and an input/output controller 150. Data processor 105 includes both CPU portion 110 and GPU core 120 on the same chip, and it is considered to be an "accelerated processing unit" (APU).

CPU portion 110 includes CPU cores 111-114 labeled "CORE0", "CORE1", "CORE2", and "CORE3", respectively, and a shared level three (L3) cache 116. Each CPU core is capable of executing instructions from an instruction set under the control of an operating system, and each core may execute a unique program thread. Each CPU core includes its own level one (L1) and level two (L2) caches, but shared L3 cache 116 is common to and shared by all CPU cores. Shared L3 cache 116 operates as a memory accessing agent to provide memory access requests including memory read bursts for cache line fills and memory write bursts for cache line writebacks.

GPU core 120 is an on-chip graphics processor and also operates as a memory accessing agent.

Interconnection circuit 130, also referred to as a "Northbridge", generally includes a system request interface (SRI)/host bridge 132 and a crossbar 134. SRI/host bridge 132 queues access requests from shared L3 cache 116 and GPU core 120 and manages outstanding transactions and completions of those transactions. Crossbar 134 is a crosspoint switch between three bidirectional ports, one of which is connected to SRI/host bridge 132.

Memory access controller 140 has a first bidirectional port connected to crossbar 134 and a second bidirectional port for connection to off-chip DRAM. Memory access controller 140 generally includes a memory controller 142 and a physical interface circuit 144 labeled "PHY". Memory controller 142 generates specific read and write transactions for requests from CPU cores 111-114 and GPU core 120. Memory controller 142 also handles the overhead of DRAM initialization, refresh, opening and closing pages, grouping transactions for efficient use of the memory bus, and the like. PHY 144 provides an interface to external DRAMs, which may be combined onto dual inline memory modules (DIMMs) by managing the physical signaling. It also performs signal training to manage signal skew to maintain transaction integrity. PHY 144 supports at least one particular memory type, and may support both DDR3 and DDR4.

Input/output controller 150 includes one or more high-speed interface controllers. For example, input/output controller 150 may contain three interface controllers that comply with the HyperTransport link protocol.

Memory system 160 includes a set of DRAMs 162, 164, 166, and 168. In the embodiment illustrated in FIG. 1, each DRAM is compliant with the JEDEC DDR4 standard. Thus data processor 105 interacts with memory 160 using properties associated with the DDR4 standard. Memory 160 is capable of operation at speeds of, for example, 1600 MHz, 1866 MHz, and 2133 MHz. In order for data processor 105 to take advantage of these capabilities while performing training efficiently, memory controller 140 performs address and command training in a manner that will be described below.

Figure 2:
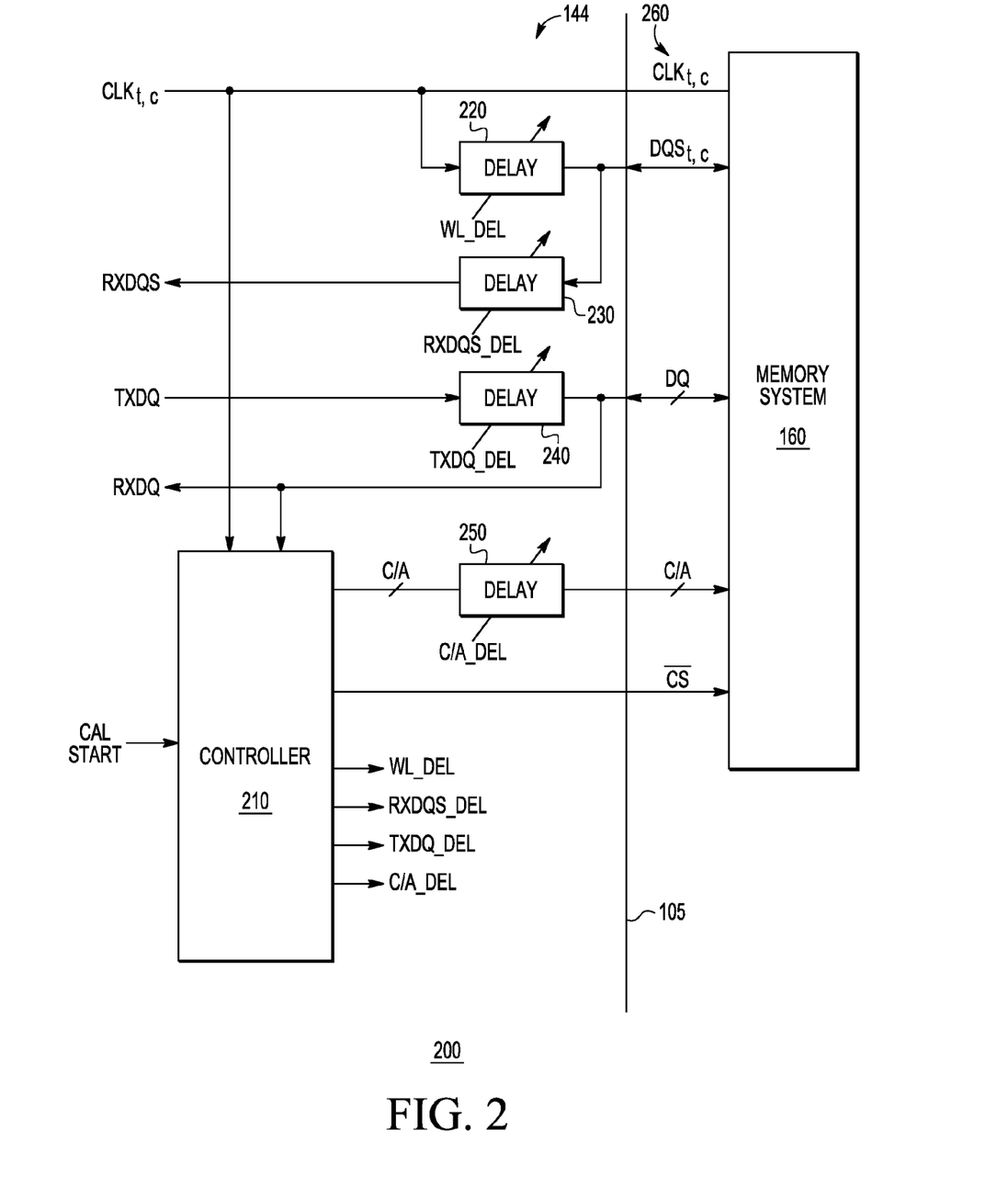
FIG. 2 illustrates in block diagram form a portion of the physical interface of the memory controller of FIG. 1.

FIG. 2 illustrates in block diagram form a portion of physical interface 144 of memory controller 140 FIG. 1. Physical interface 144 includes a controller 210 and delay elements 220, 230, 240, and 250 for connection to memory system 160 over a memory bus 260. Controller 210 has an input for receiving a calibration start control signal labeled "CAL START", an input for receiving a differential clock signal pair labeled "$CLK_{t,c}$", an input for receiving a receive data signal labeled "RXDQ", a first output for providing command and address signals labeled "C/A", a second output for providing a signal labeled "$\overline{CS}$", and a set of other control outputs. These other control outputs provide signals labeled "WL_DEL", "RXDQS_DEL", "TXDQ_DEL", and "C/A_DEL". $CLK_{t,c}$ is a differential clock signal including both a true component $CLK_t$ and a complementary component $CLK_c$. Delay element 220 has an input for receiving the $CLK_{t,c}$ signal, an output for providing a differential data strobe signal labeled "$DQS_{t,c}$", and a control input connected to an output of controller 210 for receiving the WL_DEL signal. $DQS_{t,c}$ is a differential data strobe signal including both a true component $DQS_t$ and a complementary component $DQS_c$. Delay element 230 has an input for receiving the $DQS_{t,c}$ signal, an output for providing a signal labeled "RXDQS", and a control input for receiving the RXDQS_DEL signal. Delay element 240 has an input for receiving a signal labeled "TXDQ", an output for providing a signal labeled "DQ", and a control input for receiving the TXDQ_DEL signal. Delay element 250 has an input for receiving a signal labeled "C/A", an output for providing a signal also labeled "C/A", and a control input for receiving the C/A_DEL signal. Memory system 160 has an input for receiving the $CLK_{t,c}$ signal, a bidirectional terminal for conducting the $DQS_{t,c}$ signal, a bidirectional terminal for conducting the DQ signal, an input terminal for receiving the C/A signal, and an input terminal for receiving the $\overline{CS}$ signal.

In operation, memory bus 260 is capable of very high speed operation according to the JEDEC DDR4 specification. Since the propagation delays between the data processor 105 and memory system 160 may be multiples of the clock period at these speeds, it is necessary to train the signals so that they may be validly received and the clock and strobe signals fall near the center of their respective data eyes. To obtain these delay values, physical interface 144 performs four types of training.

The first type of training is known as command and address (C/A) training C/A training involves setting C/A_DEL to an appropriate value so that the C/A signals arrive at the memory near the center of their data eye. Note that the chip select signal ($\overline{CS}$) is used as an activation signal as will be described below, and remains untrained based on the assumption that the propagation delay and loading of the $CLK_{t,c}$ signals and the $\overline{CS}$ signal are well matched and the skew small. Controller 210 performs C/A training in a manner that will be described more fully below.

The second type of training is known as "write levelization" or "write leveling". Write levelization involves setting the WL_DEL signal to an appropriate delay so that the write $DQS_{t,c}$ transitions are aligned with the $CLK_{t,c}$ transitions at the memory device pins. In DDR memory systems, the memory controller is responsible for ensuring that write data is received at the memory with the data strobe signal $DQS_{t,c}$ falling in the center of the write data eye. The first step in satisfying this requirement is to delay the $DQS_{t,c}$ signals relative to the command clock signal $CLK_{t,c}$ as they are launched by the controller. To facilitate this training, the memory chips in memory system 160 indicate when the memory clock transition is recognized by feeding back the latched value of $DQS_{t,c}$ on either one or all DQ pins. DDR3 and DDR4 memory chips return 0 on the DQ signal until it recognizes the transition at which point it returns a 1.

Finally, physical interface 144 performs receive data strobe (RXDQS) and transmit data (TXDQ) training together. RXDQS/TXDQ training involves setting RXDQS_DEL and TXDQ_DEL so that RXDQS and TXDQ are placed near an optimal sampling point, such as the center of a two-dimensional data eye.

Figure 3:
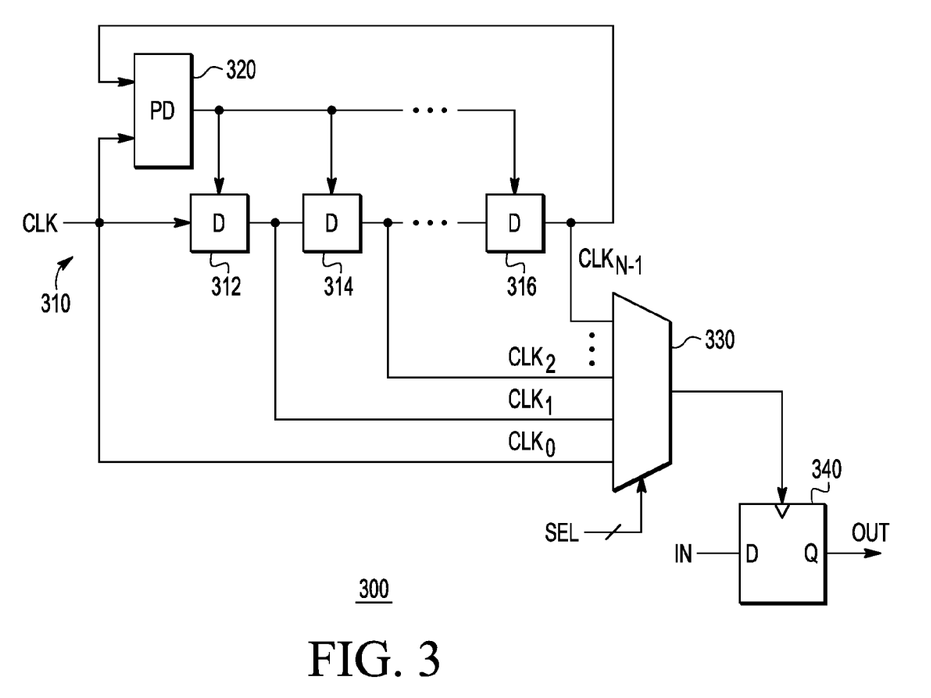
FIG. 3 illustrates in block diagram form a delay element that can be used in any of the delay elements of FIG. 2.

FIG. 3 illustrates in block diagram form a delay circuit 300 that can be used in any of delay circuits 220, 230, 240, and 250 of FIG. 2. Delay circuit 300 includes a delay chain 310, a phase detector 320, a multiplexer 330, and a latch 340. FIG. 3 illustrates a representative set of delay elements in delay chain 310 including a first delay element 312, a second delay element 314, and a last delay element 316. Each delay element has a signal input, a signal output, and a control input for receiving a control signal that controls the amount of delay. Delay element 312 has a signal input for receiving a clock signal labeled "CLK", a signal output for providing a signal labeled "$CLK_1$", and a control input. Delay element 314 has a signal input connected to the signal output of delay element 312, a signal output connected to a signal input of a succeeding delay element (not shown in FIG. 3) for providing a signal labeled "$CLK_2$", and a control input. Delay element 316 has a signal input connected to the signal output of a preceding delay element (not shown in FIG. 3), a signal output for providing a signal labeled "$CLK_{N-1}$", and a control input. Phase detector 320 has a first input connected to the signal output of delay element 316, a second input for receiving the CLK signal, and an output connected to the control inputs of each delay element. Multiplexer 330 has a first input for receiving the CLK signal (also labeled "CLK0" in FIG. 3), a second input connected to the output of delay element 312, a third input connected to the output of delay element 314, and an $N^{th}$ input connected to the signal output of delay element 316, an output, and a control input for receiving a multi-bit signal labeled "SEL". Latch 340 has a D input for receiving a signal labeled "IN", a clock input connected to the output of multiplexer 330, and a Q output for providing a signal labeled "OUT".

In operation, delay chain 310 and phase detector 320 form a delay locked loop (DLL) that divides the CLK signal into N equally-spaced clock signals. Phase detector 320 adjusts its output input until the delay from $CLK_0$ to $CLK_{N-1}$ is equal to one CLK period. Thus signal SEL selects one-of-N outputs of multiplexer 330. Latch 340 uses this selected delayed version of the CLK signal to latch the IN signal. In one particular example, N=16 to divide the CLK period into 16 substantially equal sub-periods, and SEL has 4 bits.

Figure 4:
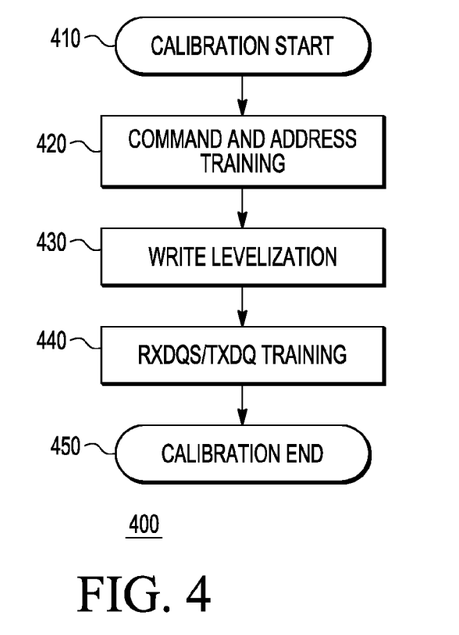
FIG. 4 illustrates a flow diagram 400 of an overall training sequence of the memory controller of FIG. 1.

FIG. 4 illustrates a flow diagram 400 of an overall training sequence of memory controller 140 of FIG. 1. Training starts at box 410. At box 420, PHY 144 performs command and address training using a technique that will be described further below. The result of command and address training is that PHY 144 determines an appropriate value for C/A_DEL. Note that the $\overline{CS}$ signal is assumed to have acceptable timing, either because it was previously trained using a known technique, or because its delay is matched closely enough to the $CLK_{t,c}$ delay that its timing need not be adjusted.

Next at box 430, PHY 144 performs write levelization. Write levelization ensures that transitions in the transmitted data strobe $DQS_{t,c}$ arrives at the memory at the same time as the main clock, $CLK_{t,c}$. To assist PHY 144 in performing write levelization, DDR memories starting with DDR3 provide support for write levelization in which it returns the value of $DQS_{t,c}$ received at the memory's input buffers on the edge of $CLK_{t,c}$. It does this by returning data signal RXDQ to indicated the value of $DQS_{t,c}$ received at the memory. In this way, PHY 144 can set this delay (WL_DEL) to the delay at which signal RXDQ signal changes at the memory pins.

Once command and address signals have been trained so that read and write operations can be reliably performed, PHY 144 performs TXDQ and RXDQS training together in box 440. During TXDQ and RXDWS training, both TXDQ_DEL and RXDQS_DEL are varied to find a two-dimensional data eye, and these values are set to the center of the data eye. Sean Searles et al. disclosed a technique for two-dimensional TXDQ/RXDQS training is in U.S. Pat. No. 7,924,637.

After all these delay values are determined by the training procedure described above, training ends in box 450. Note that memory controller 140 performs the training of flow diagram 400 separately for each dual inline memory module (DIMM) and each rank on the DIMM since their delays and skews will be different.

Figure 5:
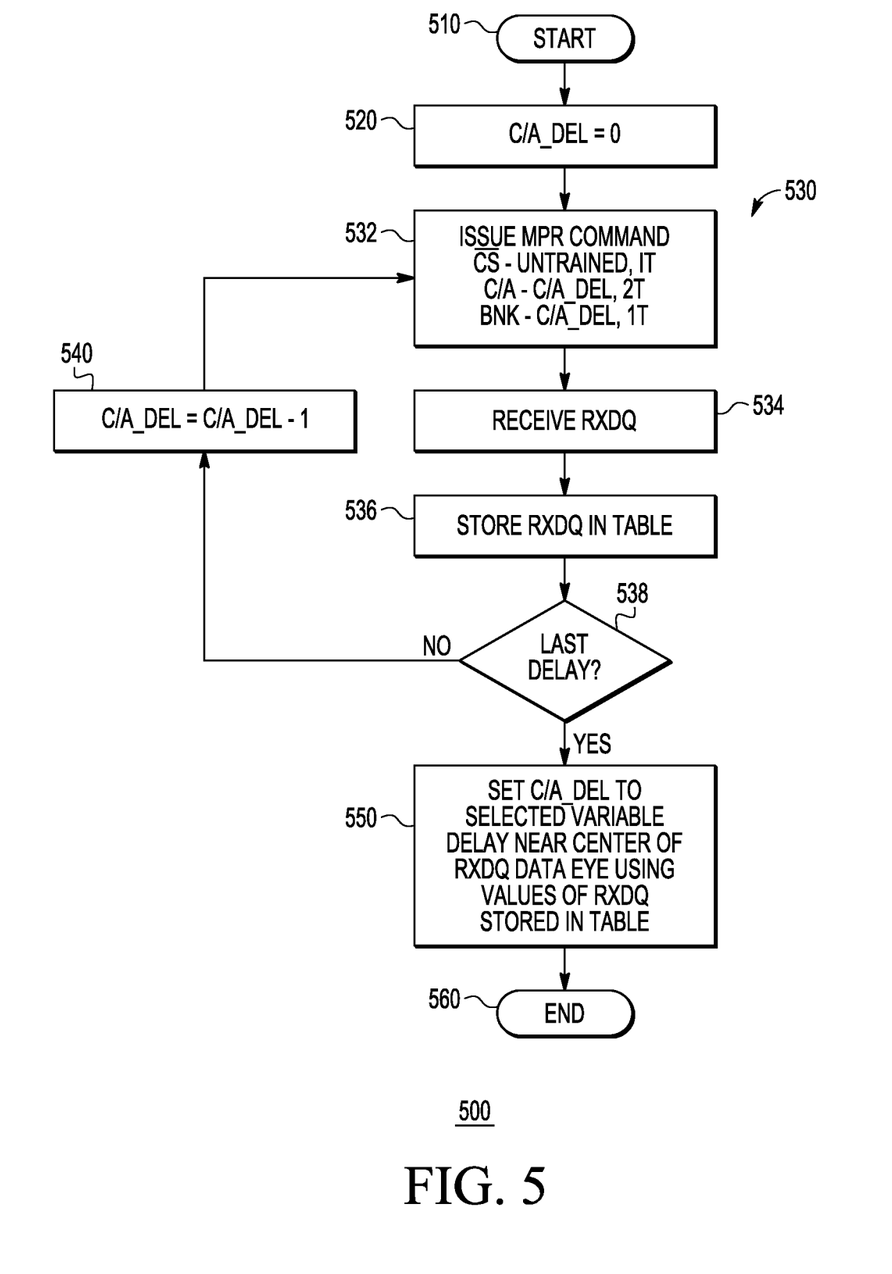
FIG. 5 illustrates a flow diagram of the command and address training of FIG. 4.

FIG. 5 illustrates a flow diagram 500 of the command and address training of FIG. 4. Flow starts at box 510. At box 520, the initial C/A_DEL value is set to 0. In alternative embodiments, the initial C/A_DEL could be set to a middle value of a range or to a software programmable seed value. In the illustrated training flow of FIG. 5, the $\overline{CS}$ signal is used as an activation signal to cause the memory to recognize a command on the command pins. The command used for command and address training is a special type of read command that returns data in different states based on the address. The $\overline{CS}$ signal is undelayed based on the assumption that $\overline{CS}$ and $CLK_{t,c}$ delays are well matched and activating $\overline{CS}$ with adequate setup and hold times around a rising edge of $CLK_t$ will be adequate to ensure that the $\overline{CS}$ signal will be received by all memories at the desired clock edge.

At box 532, training firmware causes PHY 144 to issue a multi-purpose register read (MPR) command. PHY 144 provides all command and address signals except one address signal with relaxed timing with respect to this one address signal. In this context, "relaxed timing" means a longer pulse width, which generally results in longer setup and hold times. In the particular example illustrated in FIG. 5, the remainder of the command and address signals use "2T" (relaxed) timing, in which the respective signals have twice the active times such that they are valid for two full clock periods. Then, one address signal is used to train the timing for the entire command and address group. Advantageously for use with DDR4 memories, BA[0] is used to perform the training DDR4 memories use pseduo open drain (POD) drivers with external pullups. In this case, controller 210 activates BA[0] with "1T" (not relaxed) timing with a delay over one $CLK_{t,c}$ period defined by the C/A_DEL value. The memory will recognize BA[0] when it has just enough setup time before the transition of the $CLK_{t,c}$ signal. Based on the activation of the $\overline{CS}$ signal coincident with a predetermined edge of the $CLK_{t,c}$ signals and relaxed values for the rest of the command signals, the memory recognizes an MPR read command at the predetermined edge, but the value of BA[0] seen at the DRAM will change based on the C/A_DEL value. Moreover the memory will return a value for DQ based on the recognized value of the BA[0] signal according to TABLE I:

TABLE I

| BA1:BA0 | MPR Location | DQ[7] | DQ[6] | DQ[5] | DQ[4] | DQ[3] | DQ[2] | DQ[1] | DQ[0] |
|---|---|---|---|---|---|---|---|---|---|
| 00 | MPR0 | 0 | 1 | 0 | 1 | 0 | 1 | 0 | 1 |
| 01 | MPR1 | 0 | 0 | 1 | 1 | 0 | 0 | 1 | 1 |
| 10 | MPR2 | 0 | 0 | 0 | 0 | 1 | 1 | 1 | 1 |
| 11 | MPR3 | 0 | 0 | 0 | 0 | 0 | 0 | 0 | 0 |

If BA[0] is recognized at the memory as 0, then DQ[2] will be equal to 1, and if BA[0] is recognized at the memory as 1, then DQ[2] will be equal to 0. Likewise if BA[1] is recognized at the memory as 0, then DQ[4] will be equal to 1, and if BA[1] is recognized at the memory as 1, then DQ[4] will be equal to 0. PHY 144 uses a selected one bank addresses BA[0] and BA[1] and a corresponding consequential DQ signal returned from the memory, either RXDQ[2] or RXDQ[4], respectively, to find the data eye of the bank address signal. Then it uses the value of C/A_DEL at or near the center of the data eye to delay all command and address signals by assuming their loading and skew are about the same, i.e. they are in the same timing group.

At box 534, controller 210 receives the data (RXDQ) that is the result of the MPR command. Controller 210 measures the value of RXDQ by detecting a pattern difference, such as by observing the values of RXDQ at two points in time. If the samples agree over that time period, then controller 210 determines that a transition in the RXDQ signal has taken place. If they disagree, then controller 210 determines that the results are metastable and assumes RXDQ has not yet changed.

At box 536, controller 210 stores the returned value of the RXDQ signal in a table. Then at decision box 538, controller 210 determines if the current delay is the last delay in the range. If not, then flow proceeds to box 540 in which the value of C/A_DEL is incremented by one, and the MPR command is re-issued. This sequence is repeated until all values of C/A_DEL are measured. After the last value is measured, flow proceeds to box 550, in which the final C/A_DEL value is set to the value near the center of the data eye using values stored in the table.

In an alternative embodiment, controller 210 can use a more efficient algorithm to find the center of a particular data eye. For example, it could start from a C/A_DEL of 0, and increment C/A_DEL until it finds the "left edge" of the data transition. For example, the left edge could be one or a certain number of consecutive values in a particular logic state. Similarly it could find a "right edge" by starting with a maximum C/A_DEL, and decrementing C/A_DEL until it finds the right edge. The center of the data is then determined to be the mid-point (or approximate mid-point) of the left and right edges and PHY 144 sets the final C/A_DEL to that value.

In various embodiments, the training sequence could be controlled by software such as a startup routine in BIOS and assisted in hardware as in the illustrated embodiment, or be performed with various other combinations of hardware and software.

By using just a single C/A signal with which to train the C/A timing group with relaxed timing on the remainder of the C/A pins (except for $\overline{CS}$), in this case an address and more particularly a bank address, PHY 144 can train a whole group of signals efficiently and without using any extra integrated circuit pins, thereby reducing the cost of data processor 105.

Figure 6:
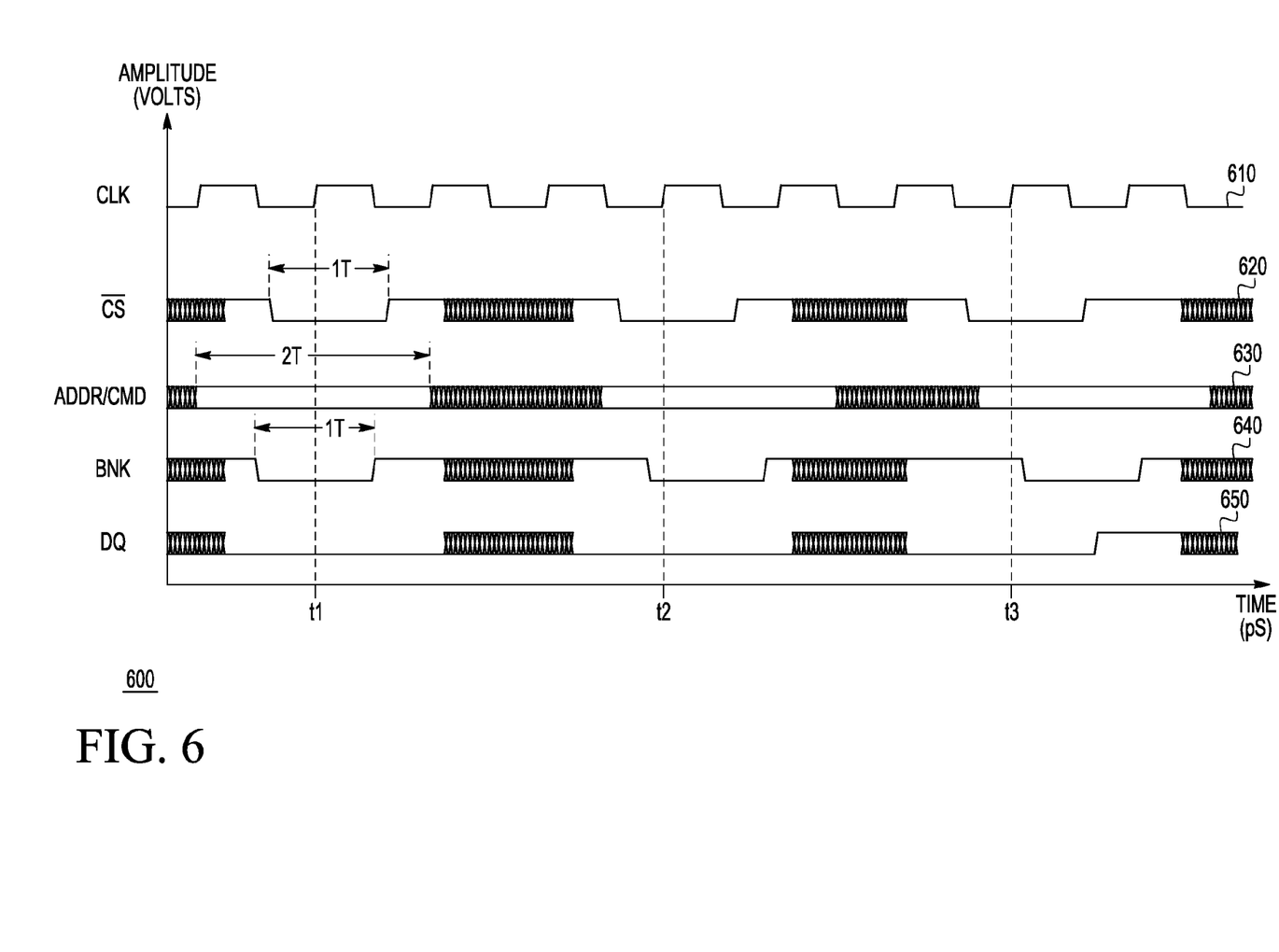
FIG. 6 illustrates a timing diagram useful in understanding the command and address training performed by the memory controller of FIG. 1.

FIG. 6 illustrates a timing diagram 600 useful in understanding the command and address training performed by memory controller 140 of FIG. 1. In FIG. 6, the horizontal axis represents time in picoseconds (ps), and the vertical axis represents the amplitude of various signals in volts. Timing diagram 600 illustrates waveforms of several signals of interest, including a CLK waveform 610, a $\overline{CS}$ waveform 620, an address and command waveform 630, a waveform 640 of selected bank address signal labeled "BNK", and a data (DQ) waveform 650. Timing diagram 600 also illustrates three time points of interest, labeled "t1", "t2", and "t3". Time t1 coincides with a rising edge of the $CLK_t$ signal in which PHY 144 provides an MPR command to memory system 160. PHY 144 provides the ADDRESS and COMMAND signals with relaxed timing so that they will have plenty of setup and hold time regardless of the routing skew between the CLK signal and the COMMAND signals.

In one particular example memory controller 140 provides the relaxed timing signals with twice the active time, known as "2T" timing. In this case, PHY 144 uses a modified delay circuit with a modified DLL that divides two period of the $CLK_{t,c}$ signal into N intervals. PHY 144 provides a single bank signal BNK with consequential timing. For example in memory controllers that support DDR4 memory, BA[0] and BA[1] are both consequential and can be used as the BNK signal, because they both cause a change in the data pattern for an MPR command based on whether the memory recognizes them as "0" or "1".

Around time t1, PHY 144 provides the BNK signal at a given delay, and ADDRESS and COMMAND signals at twice that delay, and then latches the value of the selected DQ signal on the next rising edge of the $CLK_t$ signal. PHY 144 then repetitively changes the value of BNK in subsequent MPR cycles and determines the value of C/A_DEL as described above.

Figure 7:
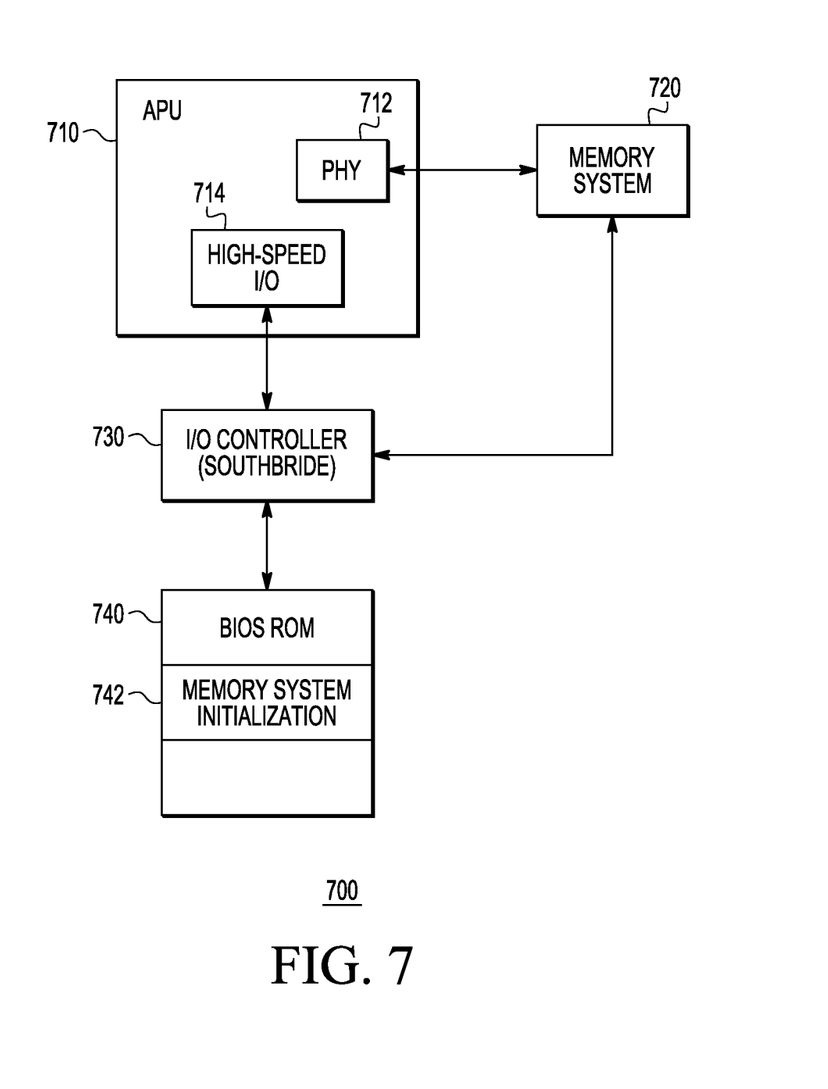
FIG. 7 illustrates in block diagram form a portion of the data processing system of FIG. 1 used to perform memory training according to some embodiments.

FIG. 7 illustrates in block diagram form a portion 700 of data processing system 100 of FIG. 1 used to perform memory training according to some embodiments. Data processing system 700 includes a data processor in the form of an accelerated processing unit (APU) 710, a memory system 720, an input/output (I/O) controller known as a "SOUTHBRIDGE" 730, and a basic input output system (BIOS) read only memory (ROM) 740. Data processor 710 has a PHY 712 connected to memory system 720 for carrying out memory access operations. In this example, memory system 720 is a DDR4 memory formed with one or more DIMMs each with one or more ranks that are separately trained. Data processor 710 is also connected through a high-speed I/O circuit 714 to I/O controller 730, which in turn is connected to both memory system 720 via a serial bus to determine its configuration, and to BIOS ROM 740.

On initialization, data processor 710 initializes data processing system 700 by reading instructions stored in BIOS ROM 740 through I/O controller 730. BIOS ROM 740 includes a memory training portion 742. Memory training portion 742 includes instructions that cause data processor 710 to configure memory controller 140 to perform the training described above. Once training is complete, the BIOS stored in BIOS ROM 730 turns control over to a resident operating system which uses memory system 720 with the trained timing values.

As noted above, some of the functions of data processing system 100 that relate to training may be implemented with various combinations of hardware and software. For example, BIOS can be used to control PHY 144 through a calibration start instruction, but then controller 210 could proceed to construct a table and determine the data eye.

Alternatively, training could be performed mostly under the control of the BIOS by providing individual MPR commands and reading returned RXDQ values to find the data eye. If implemented in software, some or all of the software components may be stored in a non-transitory computer readable storage medium for execution by at least one processor. In various embodiments, the non-transitory computer readable storage medium includes a magnetic or optical disk storage device, solid-state storage devices such as FLASH memory, or other non-volatile memory device or devices. The computer readable instructions stored on the non-transitory computer readable storage medium may be in source code, assembly language code, object code, or other instruction format that is interpreted and/or executable by one or more processors.

The circuits of FIGS. 1-3 and 7 or portions thereof may be described or represented by a computer accessible data structure in the form of a database or other data structure which can be read by a program and used, directly or indirectly, to fabricate integrated circuits with the circuits of FIGS. 1-3 and 7. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits with the circuits of FIGS. 1-3 and 7. The netlist may then be placed and routed to produce a data set describing geometric shapes to be applied to masks. The masks may then be used in various semiconductor fabrication steps to produce integrated circuits of FIGS. 1-3 and 7. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, various ways of providing relaxed timing are possible. Moreover the $\overline{CS}$ signal may be untrained, or trained separately using a known technique. In one such technique, the other command and address signals can use relaxed timing and the $\overline{CS}$ signal time can be varied. Moreover the choice of the consequential signal can be the BA[0] signal or the BA[1] signal in DDR4 memories, but could be other signals that cause the memory to react differently in other embodiments.

Accordingly, it is intended by the appended claims to cover all modifications of the disclosed embodiments that fall within the scope of the disclosed embodiments.

What is claimed is:

1. An apparatus comprising:
   a delay circuit for delaying a plurality of command and address signals according to a first delay signal and providing a plurality of delayed command and address signals to memory interface; and
   a controller for performing command and address training in which said controller provides an activation signal and a predetermined address signal of said plurality of command and address signals with first timing according to said first delay signal, and said plurality of command and address signals except said predetermined address signal with second timing, wherein said second timing is relaxed with respect to said first timing, and said controller determines an eye of timing for said predetermined address signal by repetitively providing a predetermined command on said command and address signals, varying said first delay signal, and measuring a data signal received from said memory interface.

2. The apparatus of claim 1 wherein said first timing comprises being valid for one period of a clock signal and said second timing comprises being valid for two periods of said clock signal.

3. The apparatus of claim 1 wherein said controller performs said command and address training in a training mode, and provides said plurality of command and address signals except said predetermined address signal with said first timing according to a selected variable delay to said memory interface in a normal operation mode.

4. The apparatus of claim 1 wherein said predetermined command comprises a multi-purpose register read command of a double data rate version four (DDR4) memory.

5. The apparatus of claim 1 wherein said controller measures said data signal received from said memory interface by observing said data signal at two points in time.

6. The apparatus of claim 1 wherein said activation signal comprises a chip select signal.

7. An apparatus comprising:
   a memory interface;
   a data processor for generating memory access requests during a normal operation mode and providing said memory access requests to said memory interface using a memory access controller; and
   a memory system coupled to said memory interface for receiving and responding to said memory access requests,
   wherein in a training mode, said memory access controller performs command and address training by providing an activation signal and a predetermined address signal with first timing according to a first delay signal, and a plurality of command and address signals except said predetermined address signal with second timing, wherein said second timing is relaxed with respect to said first timing, and said memory access controller determines an eye of timing for said activation signal by repetitively providing a predetermined command on said command and address signals, varying said first delay signal, and measuring a data signal received from said memory interface.

8. The apparatus of claim 7 wherein said first timing comprises being valid for one period of a clock signal and said second timing comprises being valid for two periods of said clock signal.

9. The apparatus of claim 7 wherein said memory access controller performs said command and address training in said training mode, and provides said plurality of command and address signals except said predetermined address signal with said first timing according to a selected variable delay to said memory interface in said normal operation mode.

10. The apparatus of claim 7 wherein said predetermined command comprises a multi-purpose register read command.

11. The apparatus of claim 10 wherein said memory system comprises double data rate version four (DDR4) memory.

12. The apparatus of claim 7 wherein said memory access controller measures said data signal received from said memory interface by observing said data signal at two points in time.

13. The apparatus of claim 12 wherein said memory access controller further delays a clock signal according to a second delay and performs write levelization to determine said second delay during said training mode.

14. The apparatus of claim 13 wherein said memory access controller further performs two-dimensional training to find a data eye of a receive data strobe delay signal and a transmit data delay signal.

15. The apparatus of claim 14 wherein said memory access controller further performs said two-dimensional training subsequent to said command and address training.

16. A method for training command and address signals to be provided on a memory interface comprising:
   for each of a plurality of values of a first delay signal:
      issuing a read command to the memory interface by providing an activation signal with first timing based on a clock signal, a selected address signal with said first timing according to said first delay signal, and a plurality of command and additional address signals with second timing, wherein said second timing is relaxed with respect to said first timing; and
      receiving a data feedback signal in response to said read command, and
   setting said first delay signal to a selected variable delay corresponding to a data eye of said plurality of values of said first delay signal.

17. The method of claim 16 further comprising:
   setting said first delay signal to a start value before said issuing and said receiving for each of said plurality of values of said first delay signal.

18. The method of claim 16 wherein:
   the method further comprises for each of said plurality of values of said first delay signal, storing said data feedback signal in a table; and
   wherein said setting comprises setting said first delay signal to said selected variable delay corresponding to said data eye of said plurality of values of said feedback signal using said table.

19. The method of claim 18 wherein said issuing said read command to said memory comprises:
   issuing a double data rate four (DDR4) multi-purpose register read command.

20. The method of claim 16 wherein said issuing said read command to said memory interface further comprises:
   receiving said activation signal from the memory interface; and
   providing memory data to the memory interface in response to said activation signal and said read command.
   location of said memory, wherein said log base address pointer maps said metadata log to a portion of said memory space, and to store in said metadata log a start address and a gap address used in said start-gap wear-leveling algorithm, and to access said metadata log on initialization to retrieve an initial start address and an initial gap address for use in said start-gap wear-leveling algorithm.

* * * * *